United States Patent [19]
Possin et al.

[11] Patent Number: 5,736,732
[45] Date of Patent: Apr. 7, 1998

[54] INDUCED CHARGE PREVENTION IN SEMICONDUCTOR IMAGING DEVICES

[75] Inventors: George Edward Possin, Niskayuna; Douglas Albagli, Clifton Park; Robert Forrest Kwasnick, Niskayuna, all of N.Y.; Rowland Frederick Saunders, Hartland; Habib Vafi, Waukesha, both of Wis.

[73] Assignee: General Electric Company, Schenectady, N.Y.

[21] Appl. No.: 772,641

[22] Filed: Dec. 23, 1996

[51] Int. Cl.⁶ .................................................. H01J 40/14
[52] U.S. Cl. ...................... 250/208.1; 250/239; 348/302
[58] Field of Search ................................ 250/208.1, 239, 250/578.1, 214 R; 348/302–308, 317, 281; 257/431–434; 430/56, 62, 64, 67

[56] References Cited

U.S. PATENT DOCUMENTS 4,982,079  1/1991  Yagyu ............................. 250/208.1

Primary Examiner—Que Le
Attorney, Agent, or Firm—Donald S. Ingraham

[57] ABSTRACT

An imager array includes a substrate with a plurality of superimposed layers of electrically conductive and active components. Sets of scan and data lines are electrically insulated from one another and also from a common electrode and active array components by dielectric material. Protection of the active components against static charge potential includes resistive means between the common electrode and a ground ring conductor around the array elements and in particular a thin film transistor circuit with a parallel pair of opposite polarity diode connected field effect transistors to safely drain the static charge during subsequent fabrication, test and standby period of the imager, while remaining in circuit during imager operation. Further electrostatic charge protection is provided to the array by an protective apparatus adapted to support the radiation imager while electrically contacting its ground ring to facilitate handling and processing while protecting against electrostatic charge damage during fabrication and testing, and enabling the positioning and bonding of the flexible external connections to the contact pads of the imager. Provision is made to enable heat and pressure for thermode bonding through the fixture to the contact pads while the imager is secured within the fixture.

21 Claims, 3 Drawing Sheets

INDUCED CHARGE PREVENTION IN SEMICONDUCTOR IMAGING DEVICES

This invention was made with U.S. Government support under Government Contract No. MDA 972-94-30028 awarded by DARPA. The U.S. Government has certain rights in this invention.

BACKGROUND OF INVENTION

This invention relates generally to thin film electronic arrays such as X-radiation imagers, having a matrix of electronically conductive transmission lines for controlling active components in such arrays, and more particularly to static charge protection devices for such imagers.

Imager arrays are typically fabricated on large substrates on which many components, including thin film transistors (TFTs), address lines, and devices such as photosensors, are formed through the deposition and patterning of layers of conductive, semiconductive, and insulative materials. The array is comprised of rows of pixels, with address lines and associated switching TFTs enabling the photosensor in each pixel of the array to be respectively addressed and read out. Each switching TFT is electrically coupled to a respective photosensor, such as a photodiode, which absorbs incident photons and accumulates the resulting charge. The TFT, when driven by a bias voltage on its gate line (the bias voltage being supplied via a scan line), becomes conductive and couples the photosensor to a data (or output) line enabling the charge accumulated on the photodiode to be read out by amplifiers coupled to the data lines.

The components of the imager array, such as photodiodes and their associated electrical address lines and switching devices such as TFTs, are typically fabricated on wafers or substrates and are handled frequently during fabrication, assembly, testing, and installation. Such arrays typically have a plurality of layers of electrically conductive components which must be electrically insulated from the other.

During the fabrication and testing process for an imager array, and during periods of non-use, undesired static charges between the conductive layers in the device can occur. Such induced charges on components in the arrays can result in degradation or damage of some of the devices. The damage can be obvious such as shorts between or within components, or can be subtle damage such as a change in the performance of the damaged components. Such arrays can also incorporate a ground ring which surrounds the array and serves to protect the array from some types of electrical damage to the array during handling. If a large amount of electrostatic charge is quickly delivered to the edges of the array panel during handling, the ground ring will spread this charge out over a large region. Without the ground ring, the charge will all be delivered to the nearest address line producing a large voltage on that line with catastrophic damage to one or more array devices. During some steps of processing, testing, or operation the ground ring may be held at a fixed potential near or at ground potential. Hence, the name ground ring.

During fabrication many steps involve processes which can tend to deliver an electrical charge to electrodes in the array. Examples of such processes include reactive ion etching (RIE), sputter deposition, and oxygen plasma processing, which processes are used to fabricate and pattern structures on the wafer. This charge is delivered slowly but will preferentially build up on electrodes which do not have a leakage path to other electrodes or to ground. Scan lines in the array are particularly susceptible because they are connected only to the gates of TFTs and thus have no intrinsic conductive path to any other parts of the array or to ground. If charge is delivered to the ground ring, for example, and a few scan lines have an electrical leakage path to the ground ring these scan lines will tend to charge to a higher voltage. Voltage differences as low as 50 Volts can cause permanent damage to the performance of some imager arrays. Charge can also be delivered to the array during handling.

It is desirable that any solution to the static charge problem should protect an imager array of electronic components with protection from static voltage discharge damage; permit test and repair of the imager array during the manufacturing process; provide static discharge protection during periods when voltages are not applied to the array such as periods when the imager is not in use; and be of a nature so as to not interfere with operation of the imager.

SUMMARY OF THE INVENTION

In accordance with this invention, a solid state radiation imager assembly which includes a plurality of radiation sensitive elements disposed in a matrix arrangement with a plurality of conducting address lines arranged in rows and columns, and a common electrode used to connect a bias to each radiation sensitive element in the array during normal operation. The common electrode is electrically insulated from the address lines and disposed over the array. A ground ring encircles the array of radiation sensitive elements with a current limiting coupling circuit provided between the ground conductor and the common electrode during and prior to completion of the fabrication of the radiation sensitive elements. The coupling circuit between the ground conductor and common electrode enables the draining or transfer of any charge to equilibrate the potential which may accumulate during or after manufacture, including periods of assembly, test, and non-use. The coupling circuit may comprise a pair of field effect transistors connected in parallel with reverse polarity to prevent induced charge build-up on the array during subsequent fabrication, test, repair, or non-use of the array when bias voltages are not applied. The coupling circuit alternatively or in addition comprises a resistor fabricated from the materials available in the fabrication process such as indium tin oxide (ITO) or doped amorphous silicon.

Additionally, to minimize static charge buildup during manufacturing and to facilitate ease of manufacture, a conductive protective apparatus is provided to hold and support the imager substrate during subsequent manufacture and testing. The protective apparatus includes a detachable end cover which partially encloses the array and extends over the edges of the substrate to contact the ground ring to form an electrically conductive shell around the substrate to minimize any static charge buildup during manufacturing and testing.

A slot through the bottom of the protective apparatus enables the insertion of tools for the application of heat and pressure to bond the contact pads in the array for external connection while the array is still partially encased and supported by the protective apparatus.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
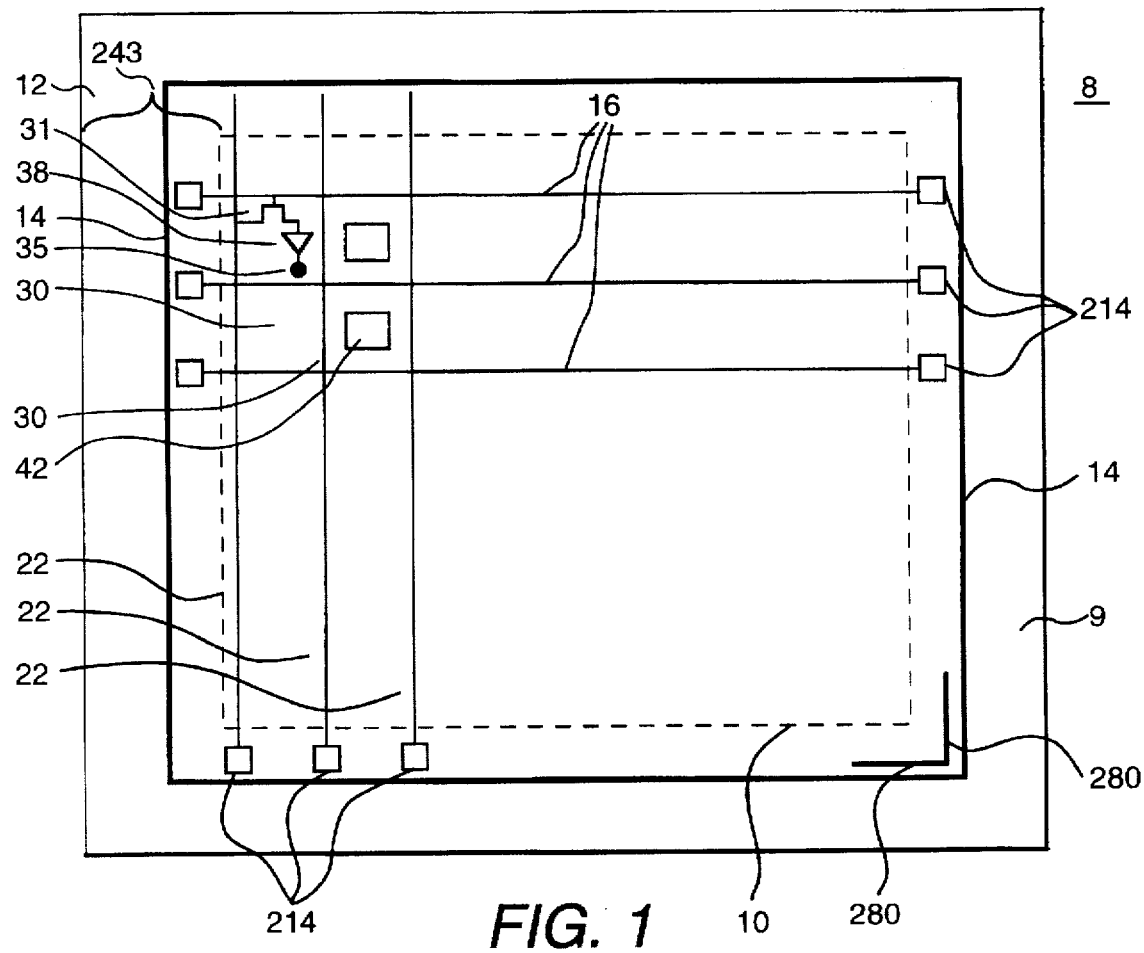
FIG. 1 is a plan view of a portion of a radiation imager array on a substrate including static charge protection in accordance with this invention.

As illustrated in FIG. 1, solid state radiation imager 8 includes a radiation or photosensor array 10 with a plurality of radiation sensitive elements thereon as described in more detail above and below. Ground ring 14 on substrate 9 is positioned within outer edge 12 of imager array 10 encircling photosensor array 10. Array 10 comprises a plurality of address lines 16 (referred to as scan lines) shown extending in the X- or horizontal direction and such as 22 (referred to as data lines) extending generally orthogonally to the scan lines along the Y-axis. The rows and columns of address lines define a matrix of pixels such as 30 disposed between the intersections of the scan lines and the data lines.

Within each pixel a radiation sensitive element (typically a photodiode or the like) 38 is disposed with a field effect thin film transistor (TFT) 31 connected between the pixel's associated scan line 16 and the associated data line 22. TFT 31 further being coupled to the photodiode 38. Radiation sensitive elements 38 are formed at each pixel 30. Connection point 35 indicates where photodiode 38 is connected to a common electrode 34 (shown schematically in FIG. 2) and which is disposed over but is insulated from the pixels 30 in imager array 10.

By way of illustration and not limitation, an array 10 comprises a matrix of about 1000 by 1000 pixels fabricated on a 10 inch by 10 inch substrate. In operation, the gate electrode of TFT 31 (FIG. 1) is driven by scan line 16 to make TFT 31 conductive. When TFT 31 is conductive, photodiode 38 is coupled to data line 22, allowing charge accumulated on the diode to be read out. Sequential scanning of pixels is achieved by mining on and off respective rows of TFTs by changes in scan line potentials. When the imager is in operation, electrode 34 is connected to a voltage bias source 33 (FIG. 2) that provides a bias different from ground potential.

During the manufacturing and processing of array 10 of radiation imager 8, a static voltage charge tends to be collected by ground ring 14, which may result from handling or from the various process steps involved in the manufacturing process such as exposure to the plasma used to deposit or etch various materials during the fabrication of TFTs 31 and photodiodes 38. If there is leakage of that static charge from ground ring 14 to scan lines such as 16, 18 and 20, or preferential deposition of electric charge on some electrodes, the scan lines can exhibit a voltage relative to the electrodes of the rest of array 10. If the voltage becomes large enough, the dielectric insulating or semiconductor material disposed between overlying layers of the various electronic components such as the TFTs 31 and photodiodes 38 is damaged, which can render the array inoperative.

In accordance with the present invention, ground ring 14 is connected via a coupling circuit 100 with common electrode 34 to establish a current-limited circuit to selectively equilibrate voltage potentials between ground ring 14 and common electrode 34. As used herein, "selectively equilibrate" and the like refers to a circuit that provides a relatively high resistance connection (e.g., $10^4$ Ohms or greater) at low voltage differences (e.g., 5 Volts or less) between ground ring 14 and common electrode 34, but which circuits may provide a lower resistance connection at higher voltage differences, as set out in more detail below. The coupling circuit 100 in accordance with this invention thus provides static discharge protection to array 10 both during fabrication and, because of the selective equilibration of charge, also during normal operation of the imager.

Voltage potentials between ground ring 14 and common electrode 34 can also effect other components in array 10 due to charge leakage between common electrode 34 and data lines such as 22 through field effect transistors 31 and photodiodes 38 in each pixel. The total capacitance of respective scan lines is primarily composed of scan-to-data and scan-to-common electrode capacitance. Hence changes in the data and common electrode potential (which are coupled) will produce a corresponding change in all scan line potentials. Thus the scan and data lines are typically at the same potential, preventing damage to the panel because there are no internal electric potentials or fields generated.

Ground ring 14 is typically, but not necessarily, disposed so as to encircle (that is, completely surround) photosensor array 10 but to be electrically isolated from components of array 10 except via coupling circuit 100. Ground ring 14 typically comprises a conductive metal of a type that is used in fabrication of conductive components within photosensor array 10, for example, aluminum, chromium, molybdenum, and the like.

Figures 2, 3:
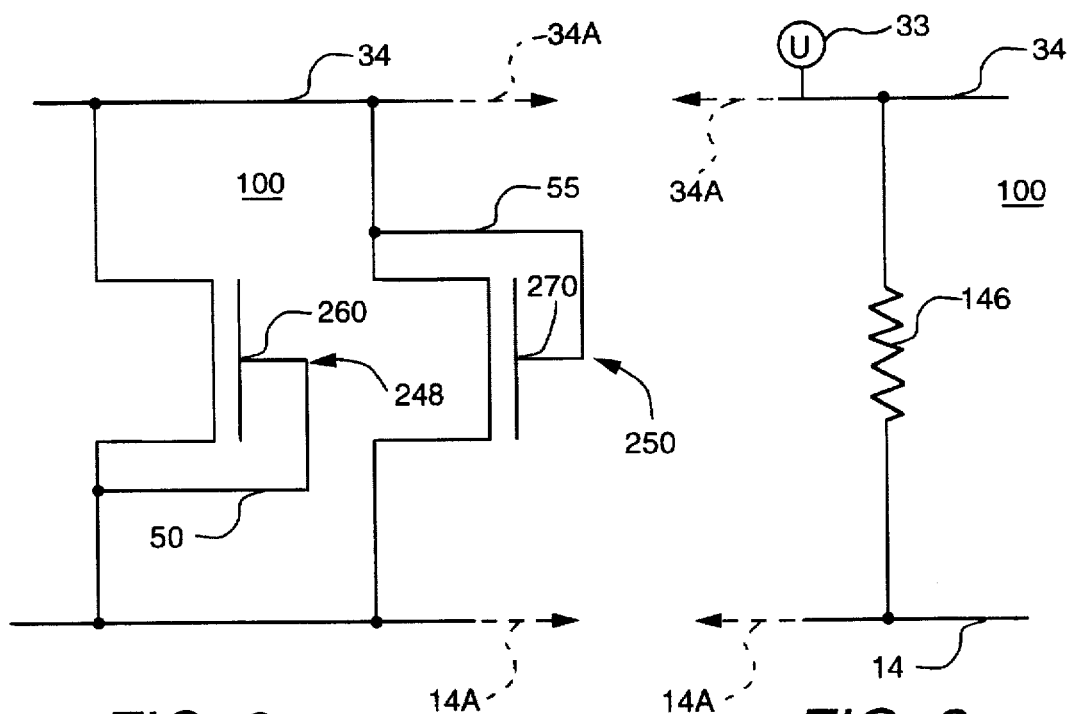
FIG. 2 is a schematic of one embodiment of a coupling circuit in accordance with the present invention.
FIG. 3 is the schematic of another embodiment of a coupling circuit in accordance with the present invention.

One embodiment of coupling circuit 100 between common electrode 34 and ground ring 146 is shown schematically in FIG. 2 with a connecting resistive element 46 being shown as a resistor providing a shunt path or connection between the common electrode and ground ring. Resistive element 146 typically comprises a resistor fabricated from a length of resistive material of a type used in the fabrication of other components of array 10. For example, indium tin oxide (ITO) (typically used for common electrode 34) or doped amorphous silicon (which is used in TFT 31) can be used to form a resistor having a desired resistance value.

Alternatively, coupling circuit 100 comprises a TFT circuit such as shown in FIG. 3. In this arrangement, a first coupling TFT 248 and a second coupling TFT 250 are coupled in parallel between common electrode 34 and ground ring 14. First coupling TFT 248 gate 260 is shorted to ground ring 14 via connection 50; second coupling TFT 250 gate 270 is shorted to common electrode 34 via connection 55. Thus first and second coupling TFTs 248, 250 are connected in parallel but with opposite orientation so that one of the transistors will always conduct at voltages above the TFT threshold voltage (each coupling TFT being fabricated to have substantially the same threshold voltage) for either sign of voltage between ground ring 14 and common electrode 34. Such a transistor arrangement in coupling circuit 100 constitutes a parallel pair of opposite polarity diode connected FETs. One advantage of the transistor coupling circuit 100 is that it has a very nonlinear current-voltage (IV) characteristic with quadratically increasing conduction at higher voltages.

Alternatively, coupling circuit 100 may comprise a parallel combination of the simple resistor (e.g., element 146 in FIG. 2) and the TFT circuit of FIG. 3. Simple resistor 146 provides conduction at low voltage (below the threshold voltage of first and second coupling TFTs 248, 250) and the TFT circuit provides lower resistance conduction at higher voltages. Such combination coupling circuit 100 is indicated schematically by dotted connections 14A and 34A in FIG. 2 and FIG. 3. Resistive element 146 of FIG. 2 is typically sized to provide more conductance at lower voltages while the transistor pair provides higher conductance at higher voltages.

Coupling circuit 100 provides static charge protection during the further fabrication steps for radiation imager 12, and coupling circuit 100 can be left in place, connected and functional, during subsequent testing and operation of radiation imager 8. The resistance of coupling circuit 100 is designed and manufactured to be in the range of about $10^4$ to about $10^6$ Ohms at about 10 Volts so that the current drain during operation with a 10 Volt bias between ground ring 14 and common electrode 34 will be in the acceptable range of about 10 microamps to about 1000 microamps. Such an additional current drain can be handled by conventional power circuitry (not shown) that provides the bias voltages during operation of radiation imager 8.

The operation of coupling circuit 100 without an operational bias potential being provided to radiation imager 8, such as during periods of radiation imager fabrication, testing, and other periods of unpowered standby operation is as follows. When a static charge collects on ground ring 14, the static charge provides a bias voltage across first and second coupling TFTs 248 and 250 that is discharged through conduction of one or the other of the TFTs with the particular one biased into conduction being dependent on the polarity of the static charge and hence on the sign of static charge bias voltage accumulated on the ground ring. The reverse connection of TFTs 248 and 250 makes one TFT of coupling circuit 100 respond such that coupling circuit 100 is insensitive to the polarity of static charge accumulated on ground ring 14.

The amount of discharge or bleed current flow depends on the resistance of the TFT conducting, the coupling circuit TFTs being sized to have a resistance in the conductive state on the order of $10^4$ to $10^6$ Ohms. Because the IV characteristic of such a TFT coupling circuit 100 is not linear, the use of term "resistance" or the like is meant only as a guide to the magnitude of the current at a particular specified voltage of the order of 10 Volts. The current through TFT coupling circuit 100 (FIG. 3) may be expressed approximately by the formula:

$$I=\mu c(W/L)(V-V_T)^2$$

in which $\mu$ is the effective channel mobility of the transistor, c is the capacitance per unit area of the gate dielectric, W is the width of the TFT channel, L the length of the TFT channel, and VT is the threshold voltage. For a typical amorphous silicon transistor, $\mu$ is of the order of 0.5 cm2/V-sec, and c is of the order of $2.5 \times 10^{-8}$ F/cm$^2$. If W=50 microns and L=5 microns, the current at 10 Volts is about 25 microamps, and the resistance at 10 Volts is about 400,000 Ohms.

Passive resistance element 146 of FIG. 2 can also be left in place during subsequent repair, and operation including standby operation of radiation imager 8. Resistive element 146 can be conveniently provided with the desired resistance by fabricating it from any of the conductive materials available in the manufacture of radiation imager 8. For example, resistive element 146 typically comprises a serpentine run of indium tin oxide (ITO) that is readily deposited and patterned during the formation of top contact for photodiode 38 and common electrode 34. Alternatively, resistive element 146 comprises gate metal used in photosensor array 10. In a further alternative, resistive element 146 may comprise doped silicon used to form the source and drain contacts of photosensor array TFTs. Resistive element 146 is of a sufficiently high resistance to limit the current drawn from the common bias circuitry in radiation imager 8 during operation and accordingly may be left in place after fabrication of the radiation imager. Resistive element 246 can be fabricated at relatively early stages of the manufacturing of radiation imager 8, thus providing a passive resistance that protects against static charges encountered prior to the deposition of first and second coupling TFTs 248, 250 on substrate 9 (which are typically deposited at the same time as array TFTs 31).

Alternatively, resistor 146 further can be provided as a temporary shunt to be removed or opened prior to operational use of radiation imager 8, being functional only during the fabrication and initial testing of imager 8. For example, if static charge protection is desired or required in a particular case only during the manufacturing process, a low resistance connecting element 146 having a low resistance (e.g., about $10^3$ Ohms or less) interconnect between common electrode 34 and ground ring 14 is provided. The reduced resistance of coupling element 146 is obtained by the use of a shorter length (than the length used for the high resistance connection discussed above) of any of the conductive layers available in the manufacturing process, such as that utilized for scan lines, data lines, or the respective conductive material deposited to form ground ring 14 or common electrode 34. Such a low resistance or direct connection results in an excessive current drain from the bias source during imager operation such that it must be opened or cut after fabrication of radiation imager 8 and prior to operation of the radiation imager. The conductive path can be cut away with a laser, or other method, prior to normal panel operation. While this severance of the low resistance element 146 is readily accomplished, static charge protection will thereafter be lost during subsequent operation of the radiation imager. This high conductivity type of interconnect can be combined with the coupling circuit 100 and removed towards the end of the process thus providing more robust protection during processing.

Coupling circuit 100 in accordance with this invention thus provides improved protection against static charge voltages during the fabrication and testing of radiation imager 8 and also during subsequent periods of non-use and repair of the equipment containing the radiation imager. Moreover, the circuit does not interfere with normal operation of the radiation imager.

Figure 4A:
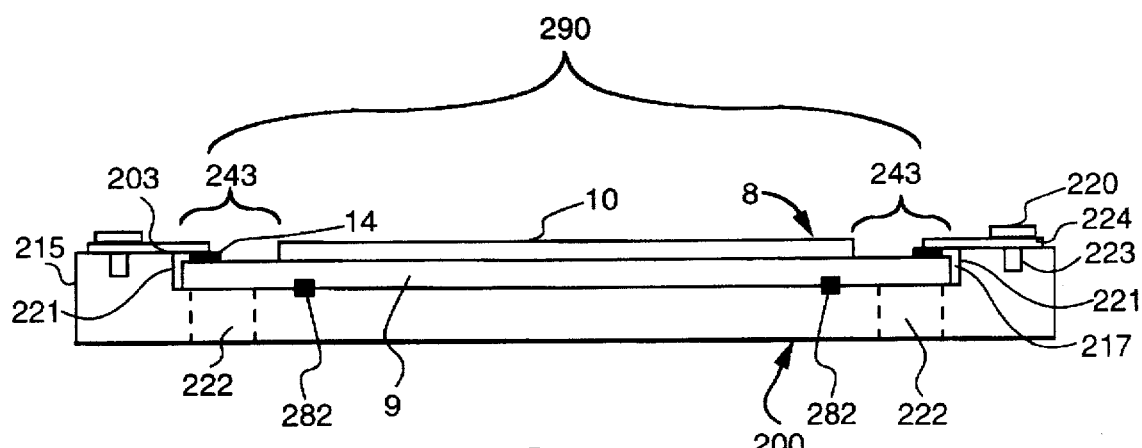
FIG. 4(A) is an elevation view in cross-section of the protective apparatus with the imager array of FIG. 1 supported therein.
Figure 4B:
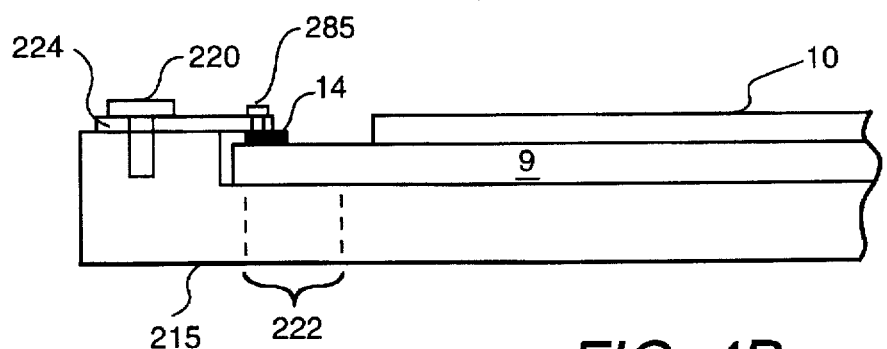
FIG. 4(B) is a more detail view of a cross section portion of the protective apparatus of FIG. 4(A) illustrating the positioning of the base and cover of the protective apparatus.
Figure 6:
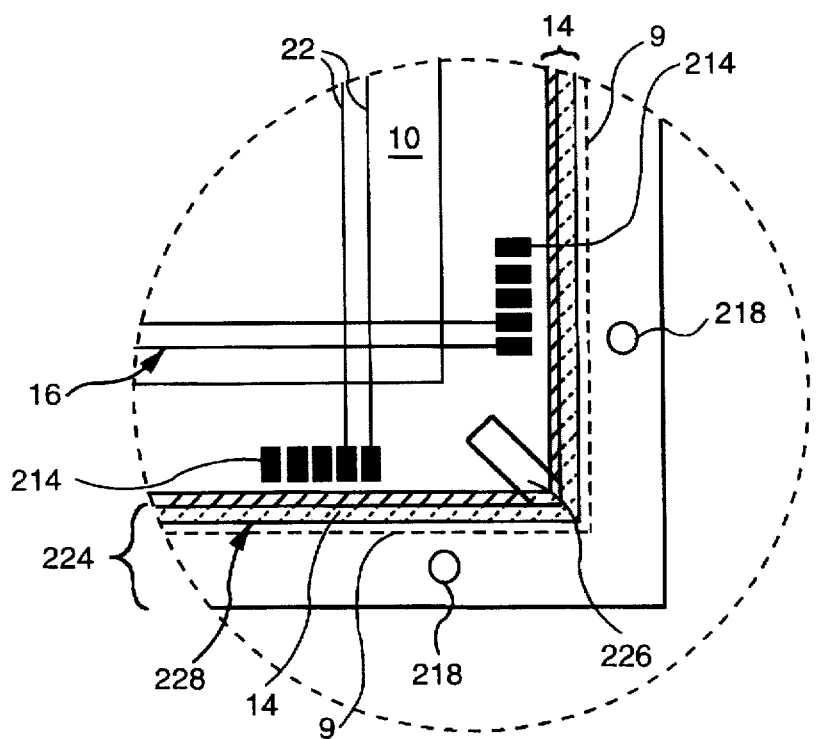
FIG. 6 is an enlarged and detailed view of the area encompassed by the dotted circle 4 in FIG. 5 (with the cover plate in place).
Figure 5:
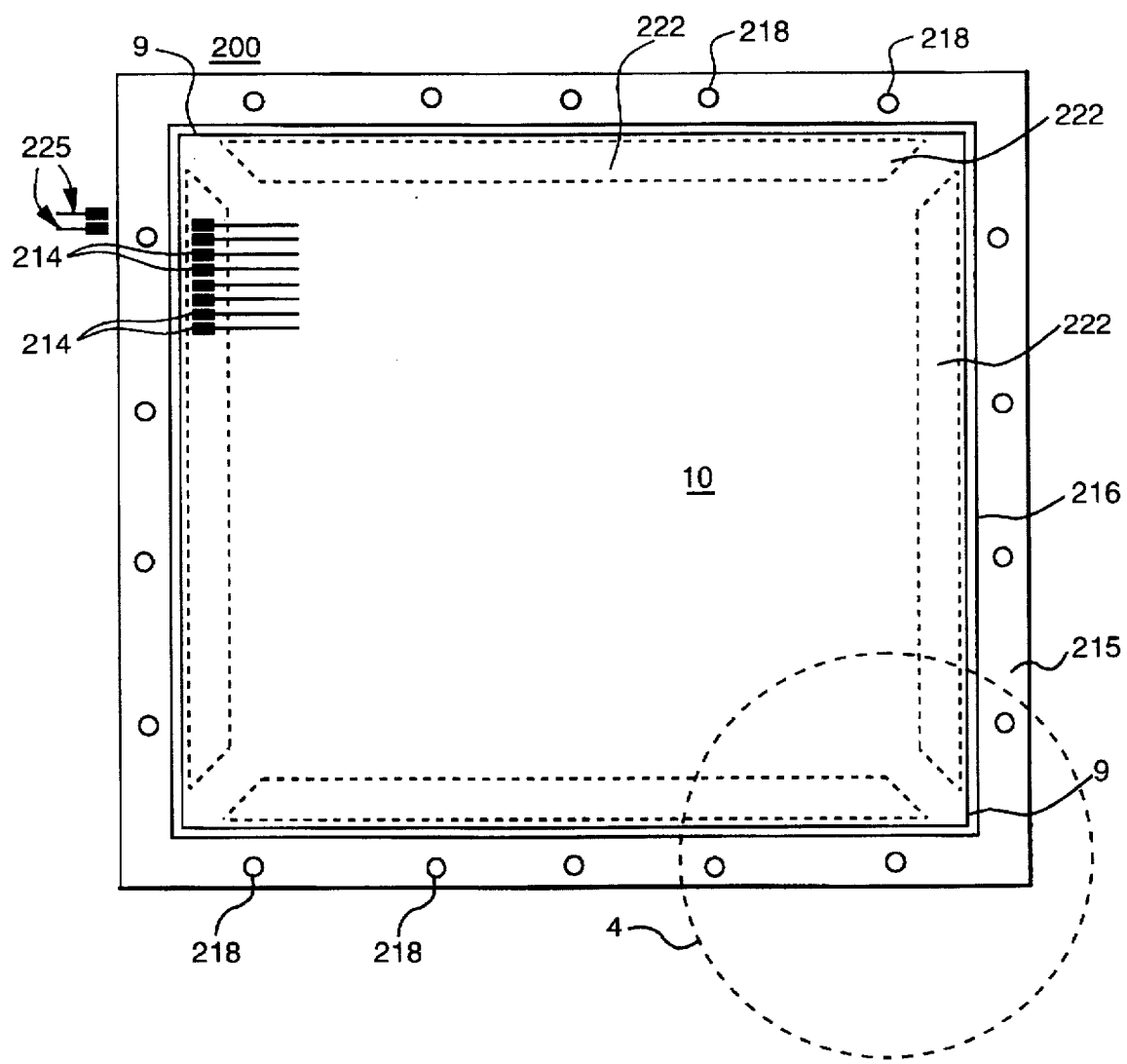
FIG. 5 is a top view of the protective apparatus in FIG. 2 (without the cover).

Further protection of imager 8 from static discharge is provided in accordance with the present invention by protective apparatus 200 (as illustrated in FIGS. 4, 5, and 6) is provided to support and protect radiation imager 8 during its latter phases of fabrication and testing, and specifically after the perimeter pieces of substrate 9 outside ground ring 14 are removed.

Referring to FIGS. 4(A) and 4(B), 5, and 6, radiation imager 10 is partially enclosed and supported by protective apparatus 200. Protective apparatus 200 comprises a base 215 with an indentation or cavity 217 suitably dimensioned for the insertion and retention of insulating substrate 9 (with photosensor array 10 disposed thereon). Cover plate 224 is disposed over imager 8 and is disposed so as to be electrically coupled to the ground ring 14 of imager 8. Cover 224 is typically supported on sidewalls 221 of base 215 framing the outer portions of centrally located radiation imager 10 (that is, cover 224 provides an open area 290 (FIG. 4A) over array 10 to allow access to, testing, and operation of array components), with bottom edge region 203 of the cover plate electrically contacting ground ring 14 as shown in FIG. 4A and 4B. A plurality of fasteners 220 passing through receiving holes 218 (FIG. 5) are screwed into threaded holes 223 in base 215 of protective apparatus 200 enabling selective attaching and detaching of cover plate 224 around radiation imager 8 before and after external flexible contact material is attached to respective ones of contact fingers 214 on the imager to provide coupling between readout electronics (not shown) and the like and address lines for photosensor array 10.

Cover plate 224 may comprise corner tabs 226 as illustrated in FIG. 6. Corner tabs 226 of cover plate 224 extend diagonally from the corners of the cover plate towards the center of imager array area and are disposed to overlay insulating substrate 9 (see FIG. 4(A) and 4(B)) and assist in applying downward pressure upon tightening of bolts 220 to provide positive electrical contact between the top plate 224 and ground ring 14. The corner tabs extend through areas free of contact pads 214. To further enhance positive electrical contact between protective apparatus 200 and ground ring 14, in one embodiment of the present invention, small electrically conducting fasteners 285 (FIG. 4(B)) can be positioned to extend from top plate 224 to directly contact ground ring 14 (see FIG. 6). To facilitate ease of assembly, cavity 217 of base 215 is slightly larger in area than the size of radiation imager 8. Also, cover plate 224 may comprise two or more pieces (e.g., four pieces, such as one corresponding to each side of assembly 200); alternatively, cover 224 comprises a unitary assembly that can be disposed over base 215. Proper positioning and alignment of the radiation imager 8 within cavity 217 (see FIG. 4) of base 215 is accomplished by registration means; by way of example and not limitation, visual alignment of registration marks 280 (FIG. 1) on substrate 9 with alignment marks 282 on base 215 can be used.

Protective apparatus 200 thus supports radiation imager 8 which is clamped therein with electrical contact between the conductive protective cover plate 224 and ground ring 14 surrounding active imaging array 10 with contact pads 214 exposed to enable subsequent bonding to external connectors. End regions 243 (FIG. 1) of insulating substrate 9 typically comprise a relatively large field about one centimeter wide with ground ring 14 on the insulating substrate. Protective apparatus 200 prevents or minimizes the generation of electrostatic charges within its enclosed region forming an electrically conductive shell with contact to ground ring 14 and connection through circuitry to common electrode 34 (as described below) around the substrate during subsequent processing and testing of radiation imager 8. Protective apparatus 200 also provides protection and facilitates the handling of radiation imager 8, providing an enclosure around the area of contact pads 214 and ground ring 14. Conductive paths including address lines 22 are exposed. Electrostatic charges and damage cannot easily be induced because of the enclosure including base 215, top plate 224 and electrical connection to ground ring 14 which minimize or prevent accumulation of electrostatic charges which might otherwise damage radiation imager 8.

Electrical contacts 225 (representative ones of which are illustrated in FIG. 5), typically thousands in number, from the exterior of radiation imager 8 to couple address lines on the array to readout and control electronics (not shown) are coupled to contact pads 214 on insulating substrate 9 by thermal and pressure bonding of flexible circuit material to the contact pads 214. Protective apparatus 200 allows the use of a thermode system to accomplish the bonding while radiation imager 8 is supported within protective apparatus 200. Thermode system tools access to the underside of substrate 9 on which contact fingers 214 are disposed is provided by slots 222 (FIG. 4(A)) which extend through base 215 in the region below contact pads 214. An aligned sandwich of the flexible coupling to external electronics, such as copper on polyimide as that sold by E.I. DuPont under their brand name Kapton with an interposed anisotropic conducting film, can be made to contact pads 214. Protective apparatus 200 allows access to the top of contact pads 214 for application of flexible circuit and positioning of a thermode system above the assembly cover 224 does not extend over the region of substrate 9 on which contact pads 14 are disposed. The open central region 290 (FIG. 4(A)) of cover plate 224 not only allows bonding access to contact pads 214 but also allows removal of the top frame without damage to the flex-imager contact assembly. After the flexible circuit attachment, the possibility of electrostatic charge and electrostatic damage is greatly reduced such that cover 224 can be removed and radiation imager 8 can then be mounted into an imaging system such as X-ray system. Alternatively, imager 8 is left within assembly 200 during normal operation, with assembly 200 providing an effective housing for imager during radiation imaging.

While only certain features of the invention have been illustrated and described herein, modifications and changes will occur to those skilled in the art. It is, therefore, to be understood that the appended claims are intended to cover such modifications and changes that fall within the true spirit of the invention.

What is claimed is:

1. An X-Y-addressed solid state radiation imager protected from static charge buildup during periods of operation and non-operation, said imager comprising:

a photosensor array comprising a plurality of address lines disposed in respective rows and columns, a plurality of radiation sensitive elements disposed in a matrix arrangement and coupled to respective ones of said address lines, a common electrode structure disposed over said address lines and said radiation sensitive elements so as to be electrically insulated from said address lines and coupled to said radiation sensitive elements;

a ground ring disposed around the periphery of said matrix arrangement of said radiation sensitive elements; and a coupling circuit electrically coupled between said ground conductor and said common electrode so as to provide an electrical connection to selectively equilibrate voltage potential between said common electrode and said ground ring.

2. The radiation imager of claim 1 wherein said coupling circuit comprises a resistive element having a resistance greater than about $10^4$ Ohms.

3. The radiation imager of claim 1 wherein said coupling circuit comprises at least two field effect transistors.

4. The radiation imager of claim 3 wherein said coupling circuit comprises a pair of opposite polarity connected field effect transistors coupled in parallel between said ground ring and said common electrode.

5. The radiation imager of claim 4 wherein said pair of opposite polarity connected field effect transistors comprises a first thin film transistor having its gate electrode electrically connected to said ground ring and a second thin film transistor having its gate electrode electrically coupled to said common electrode.

6. The radiation imager of claim 4 wherein said coupling circuit further comprises a resistive element electrically coupled in parallel with said pair of field effect transistors.

7. The radiation imager of claim 1 wherein said ground ring encircles said matrix arrangement of said radiation sensitive elements and each of said radiation sensitive elements comprise a thin film field effect transistor and a photodiode having one terminal thereof connected to said common electrode.

8. The radiation imager of claim 2 wherein said resistive element has a resistance in the range of about $10^4$ Ohms to about $10^6$ Ohms.

9. The radiation imager of claim 8 wherein said resistive element is fabricated of a conductive material selected from the group of conductive materials used in fabrication of said address lines, said common electrode, said ground ring, and said radiation sensitive elements.

10. The radiation imager of claim 1 further comprises a low-resistance resistive element coupled in parallel with said coupling circuit, said low-resistance having a resistance of less than about $10^3$ Ohms, whereby said low resistance resistive element provides additional static charge protection during fabrication and which low resistance element is open-circuited before operational use of said imager.

11. A protective apparatus to support a radiation imager, the imager having a photosensor array disposed on an insulating substrate and a ground ring disposed around the photosensor array on the substrate, and to protect the imager against damage from electrostatic charges during assembly and attachment of external electrical contacts, said apparatus comprising:

an electrically conductive frame;

said frame comprising a base open on a top side to receive said imager and configured so as to extend around said imager substrate; and a cover detachably connectable to said base to form a cavity within which said imager array is enclosed, said cover being disposed to overlie said ground ring on said substrate without contacting said photosensor array disposed on the imager substrate, said cover further being electrically coupled to said ground ring so as to establish a static charge protection enclosure surrounding said imager.

12. Protective apparatus for an imager array of claim 11 including at least one access slot through a peripheral region of said base so as to allow access to a plurality of contact pads disposed on said imager to provide external electrical contact to said imager.

13. Protective apparatus of claim 11 wherein said access slot in said base is dimensioned to enable the application of heat and pressure to said contact pads while said array is secured within said frame to coupled external circuitry connections to said contact pads.

14. Protective apparatus of claim 11 wherein said apparatus further comprises a plurality of tabs extending from said cover over said ground ring to provide mechanical support of said imager array and additionally provide electrical contact between said imager ground ring and said protective apparatus.

15. Protective apparatus of claim 11 wherein the electrical coupling between said assembly and said imager ground ring comprises at least one conductive fastener disposed through said cover and positioned to contact said ground ring.

16. Protective apparatus of claim 11 wherein said assembly further comprises registration means to align said array within said cavity.

17. Protective apparatus of claim 11 wherein said cover comprises a plurality of members.

18. A radiation imager assembly protected from static charge buildup during periods of operation and non-operation, said assembly comprising:

a photosensor array disposed on a substrate, said photosensor comprising a plurality of radiation sensitive elements disposed in a matrix arrangement, said array further comprising a common electrode structure disposed over said radiation sensitive elements and electrically coupled to said radiation sensitive elements;

a ground ring disposed around the periphery of said matrix arrangement of said radiation sensitive elements;

a coupling circuit electrically coupled between said ground conductor and said common electrode so as to provide an electrical connection to selectively equilibrate voltage potential between said common electrode and said ground ring; and a protective apparatus disposed around portions of said substrate and said photosensor array so as to support said substrate and provide openings for access to said photosensor array and to a plurality of contact fingers disposed on said substrate, said contact fingers extending from said photosensor array to provide electrical contact thereto;

said protective apparatus being electrically coupled to said ground ring of said imager so as to protect the imager against damage from electrostatic charges during assembly and attachment of external electrical contacts.

19. The radiation imager assembly of claim 18 wherein said coupling circuit comprises a pair of opposite polarity diode connected field effect transistors coupled in parallel between said ground ring and said common electrode.

20. The radiation imager assembly of claim 19 wherein said coupling circuit further comprises a resistive element electrically coupled in parallel with said pair of field effect transistors.

21. The radiation imager assembly of claim 19 wherein said protective apparatus comprises:

an electrically conductive frame configured to extend around said substrate; and a cover detachably connectable to said base to form a cavity within which said substrate and photosensor array are enclosed, said cover being disposed to overlie said ground ring on said substrate without contacting said photosensor array disposed on the imager substrate.

* * * * *